US008644773B2

(12) United States Patent
Cebi

(10) Patent No.: US 8,644,773 B2
(45) Date of Patent: Feb. 4, 2014

(54) MULTIBAND LOW NOISE AMPLIFIER (LNA) WITH PARALLEL RESONANT FEEDBACK

(75) Inventor: Haki Cebi, Allston, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 613 days.

(21) Appl. No.: 12/634,706

(22) Filed: Dec. 10, 2009

(65) Prior Publication Data

US 2011/0143685 A1 Jun. 16, 2011

(51) Int. Cl.
*H04B 1/38* (2006.01)

(52) U.S. Cl.
USPC .......... 455/73; 455/341; 455/334; 455/232.1; 455/333; 455/317; 455/183.1; 330/109; 330/291; 330/294

(58) Field of Classification Search
USPC .......... 455/73, 41.2, 69, 82, 127.3, 144, 341, 455/194.2, 293, 311, 334, 232.1, 333, 227, 455/225, 217, 183.1; 330/291, 109, 294
See application file for complete search history.

(56) References Cited

U.S. PATENT DOCUMENTS

| | | | | | |
|---|---|---|---|---|---|
| 2,894,126 | A | * | 7/1959 | Horgan | 455/293 |
| 3,037,114 | A | * | 5/1962 | Bier et al. | 455/277.1 |
| 3,133,252 | A | * | 5/1964 | Skolnick et al. | 455/352 |
| 3,358,226 | A | * | 12/1967 | Clinton | 324/526 |
| 3,621,151 | A | * | 11/1971 | Wood | 360/64 |
| 3,838,364 | A | * | 9/1974 | Kurokawa | 333/28 R |
| 4,046,960 | A | * | 9/1977 | Veale | 381/103 |
| 4,225,834 | A | * | 9/1980 | van Doorn | 333/242 |
| 4,793,356 | A | * | 12/1988 | Misic et al. | 600/422 |
| 5,051,700 | A | * | 9/1991 | Fox | 324/322 |
| 5,105,165 | A | | 4/1992 | Bien | |
| 6,417,745 | B1 | * | 7/2002 | Taniguchi | 333/185 |
| 6,674,337 | B2 | * | 1/2004 | Hashemi et al. | 333/32 |
| 6,978,162 | B2 | * | 12/2005 | Russell et al. | 455/575.2 |
| 7,149,497 | B2 | * | 12/2006 | Kagaya et al. | 455/334 |
| 2003/0193369 | A1 | * | 10/2003 | Jackson et al. | 330/51 |
| 2004/0145410 | A1 | * | 7/2004 | Selz | 330/107 |
| 2005/0233706 | A1 | * | 10/2005 | Takeda | 455/78 |
| 2005/0270104 | A1 | * | 12/2005 | Yamamoto | 330/293 |
| 2006/0186829 | A1 | * | 8/2006 | Zhang et al. | 315/244 |
| 2006/0217089 | A1 | * | 9/2006 | Snelgrove et al. | 455/127.2 |
| 2007/0155355 | A1 | * | 7/2007 | Lynch | 455/323 |
| 2007/0207754 | A1 | * | 9/2007 | Gomi | 455/193.3 |
| 2009/0051453 | A1 | * | 2/2009 | Chung et al. | 331/117 R |

(Continued)

OTHER PUBLICATIONS

Orr, Radio Handbook, Twentieth Edition, p. 4.33.

*Primary Examiner* — Temesgh Ghebretinsae
*Assistant Examiner* — Md Talukder
(74) *Attorney, Agent, or Firm* — Knobbe, Martens, Olson & Bear, LLP

(57) ABSTRACT

A multiband low noise amplifier (LNA) with parallel resonant feedback includes an amplifier element configured to receive a radio frequency (RF) signal at an RF input and provide an amplified version of the RF signal at an RF output, a resistive feedback circuit coupled between the RF input and the RF output, and a plurality of series-coupled resonant circuits coupled in series with the resistive feedback circuit between the RF input and the RF output of the amplifier element, wherein each of the resonant circuits is configured to operate as an effective short circuit at a frequency other than a resonant frequency and configured to operate as an effective open circuit at the resonant frequency to decouple the resistive feedback from the amplifier element at each resonant frequency.

19 Claims, 4 Drawing Sheets

(56) References Cited

U.S. PATENT DOCUMENTS

2009/0102552 A1* 4/2009 Shiramizu et al. .............. 330/98
2009/0323864 A1* 12/2009 Tired ............................ 375/319
2011/0143685 A1* 6/2011 Cebi ............................... 455/73

* cited by examiner

MULTIBAND LOW NOISE AMPLIFIER (LNA) WITH PARALLEL RESONANT FEEDBACK

BACKGROUND

Portable communication devices, such as cellular telephones, personal digital assistants (PDAs), WiFi transceivers, and other communication devices transmit and receive communication signal at various frequencies that correspond to different communication bands and at varying power levels. A typical receiver in one of these communication devices must be capable of receiving, amplifying, downconverting and extracting useful information from the received signal. The signal received by these devices is typically very weak and is usually amplified prior to subsequent processing. Such an amplifier is referred to as a low noise amplifier (LNA) and is typically implemented to contribute little noise, to provide flat gain and to provide good input and output return loss and linearity.

In a multiple receive band system a single LNA can be implemented for each receive band to meet noise figure requirements for the multiple receive frequencies. Unfortunately, implementing multiple LNAs for multiple receive bands is costly, consumes valuable area on the semiconductor die, and often leads to signal degradation.

Alternatively, a single LNA can be implemented to cover multiple receive frequencies, but such an implementation must use resistive feedback to maintain an acceptable noise figure. Unfortunately, at some frequencies, resistive feedback degrades reverse isolation, degrades return loss, and increases the noise figure.

Therefore, it is desirable to have a receiver that implements a single LNA that overcomes the limitations described above.

SUMMARY

Embodiments of a multiband low noise amplifier (LNA) with parallel resonant feedback include an amplifier element configured to receive a radio frequency (RF) signal at an RF input and provide an amplified version of the RF signal at an RF output, a resistive feedback circuit coupled between the RF input and the RF output, and a plurality of series-coupled resonant circuits coupled in series with the resistive feedback circuit between the RF input and the RF output of the amplifier element, wherein each of the resonant circuits is configured to operate as an effective short circuit at a frequency other than a resonant frequency and configured to operate as an effective open circuit at the resonant frequency to decouple the resistive feedback from the amplifier element at each resonant frequency.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
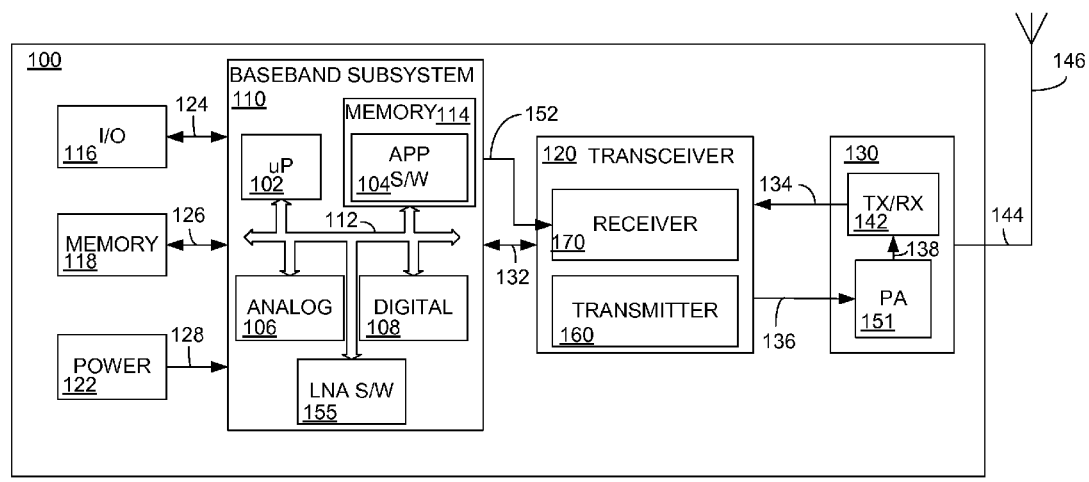
FIG. 1 is a block diagram illustrating a simplified portable communication device.

Although described with particular reference to a portable communication device, such as a portable cellular telephone or a personal digital assistant (PDA), the multiband low noise amplifier (LNA) with parallel resonant feedback can be used in any device or system that amplifies a receive signal using an amplifier. The multiband LNA with parallel resonant feedback can be implemented as part of an integrated module that contains other circuit elements, or can be implemented as a discrete module.

The multiband LNA with parallel resonant feedback can be implemented in hardware, and, in an embodiment, can be controlled by software or firmware components. When implemented in hardware, the multiband LNA with parallel resonant feedback can be implemented using specialized hardware elements and control logic. When control components of the multiband LNA with parallel resonant feedback are implemented, at least partially in software, or implemented in a system that employs software control of various elements or components, the software portion can be used to precisely control the various components of the multiband LNA with parallel resonant feedback. The software can be stored in a memory and executed by a suitable instruction execution system (microprocessor). The hardware implementation of the multiband LNA with parallel resonant feedback can include any or a combination of the following technologies, which are all well known in the art: discrete electronic components, integrated electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the multiband LNA with parallel resonant feedback comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

FIG. 1 is a block diagram illustrating a simplified portable communication device 100. In an embodiment, the portable communication device 100 can be a portable cellular telephone. Embodiments of the multiband LNA with parallel resonant feedback can be implemented in any device having an RF receiver, and in this example, are implemented in a portable communication device 100. The portable communication device 100 illustrated in FIG. 1 is intended to be a simplified example of a cellular telephone and to illustrate one of many possible applications in which the multiband LNA with parallel resonant feedback can be implemented. One having ordinary skill in the art will understand the operation of a portable cellular telephone, and, as such, implementation details are omitted. The portable communication device 100 includes a baseband subsystem 110, a transceiver 120, and a front end module (FEM) 130. Although not shown for clarity, the transceiver 120 generally includes modulation and upconversion circuitry for preparing a baseband information signal for amplification and transmission, and includes filtering and downconversion circuitry for receiving and downconverting an RF signal to a baseband information signal to recover data. The details of the operation of the transceiver 120 are known to those skilled in the art.

The baseband subsystem generally includes a processor 102, which can be a general purpose or special purpose microprocessor, memory 114, application software 104, analog circuit elements 106, digital circuit elements 108 and LNA software 155, coupled over a system bus 112. The system bus 112 can include the physical and logical connections to couple the above-described elements together and enable their interoperability.

An input/output (I/O) element 116 is connected to the baseband subsystem 110 over connection 124, a memory element 118 is coupled to the baseband subsystem 110 over connection 126 and a power source 122 is connected to the baseband subsystem 110 over connection 128. The I/O element 116 can include, for example, a microphone, a keypad, a speaker, a pointing device, user interface control elements, and any other device or system that allows a user to provide input commands and receive outputs from the portable communication device 100.

The memory 118 can be any type of volatile or non-volatile memory, and in an embodiment, can include flash memory. The memory element 118 can be permanently installed in the portable communication device 100, or can be a removable memory element, such as a removable memory card.

The power source 122 can be, for example, a battery, or other rechargeable power source, or can be an adaptor that converts AC power to the correct voltage used by the portable communication device 100. In an embodiment, the power source can be a battery that provides a nominal voltage output of approximately 3.0 volts (V). However, the output voltage range of the power source can range from approximately 1.0 to 5.0 V.

The processor 102 can be any processor that executes the application software 104 to control the operation and functionality of the portable communication device 100. The memory 114 can be volatile or non-volatile memory, and in an embodiment, can be non-volatile memory that stores the application software 104. If portions of the control logic of the multiband LNA with parallel resonant feedback are implemented in software, then the baseband subsystem 110 also includes LNA software 155, which may cooperate with control logic that can be executed by the microprocessor 102, or by another processor, to control at least some aspects of the operation of the multiband LNA with parallel resonant feedback 300 to be described below.

The analog circuitry 106 and the digital circuitry 108 include the signal processing, signal conversion, and logic that convert an input signal provided by the I/O element 116 to an information signal that is to be transmitted. Similarly, the analog circuitry 106 and the digital circuitry 108 include the signal processing, signal conversion, and logic that convert a received signal provided by the transceiver 120 to an information signal that contains recovered information. The digital circuitry 108 can include, for example, a digital signal processor (DSP), a field programmable gate array (FPGA), or any other processing device. Because the baseband subsystem 110 includes both analog and digital elements, it is sometimes referred to as a mixed signal device (MSD).

In an embodiment, the front end module 130 includes a transmit/receive (TX/RX) switch 142 and a power amplifier 151. The TX/RX switch 142 can be a duplexer, a diplexer, or any other physical or logical device or circuitry that separates a transmit signal and a receive signal. Depending on the implementation of the portable communication device 100, the TX/RX switch 142 may be implemented to provide half-duplex or full-duplex functionality. A transmit signal provided by the transceiver 120 over connection 136 is directed to the power amplifier 151. The output of the power amplifier 151 is provided over connection 138 to the TX/RX switch 142, and then to an antenna 146 over connection 144.

A signal received by the antenna 146 is provided over connection 144 to the TX/RX switch 142, which provides the received signal over connection 134 to the transceiver 120. As will be described in detail below, the transceiver 120 includes a receiver 170 that can be implemented using embodiments of the multiband LNA with parallel resonant feedback.

In an embodiment, the baseband subsystem 110 provides one or more control signals to the receiver 170 over connection 152. Connection 152 can be implemented as discrete connections, or as a bus having multiple signals. In an embodiment, a power, or mode selection, signal, a power amplifier enable signal, one or more reference voltage levels, and other control signals can be provided over connection 152 to the receiver 170.

Figure 2:
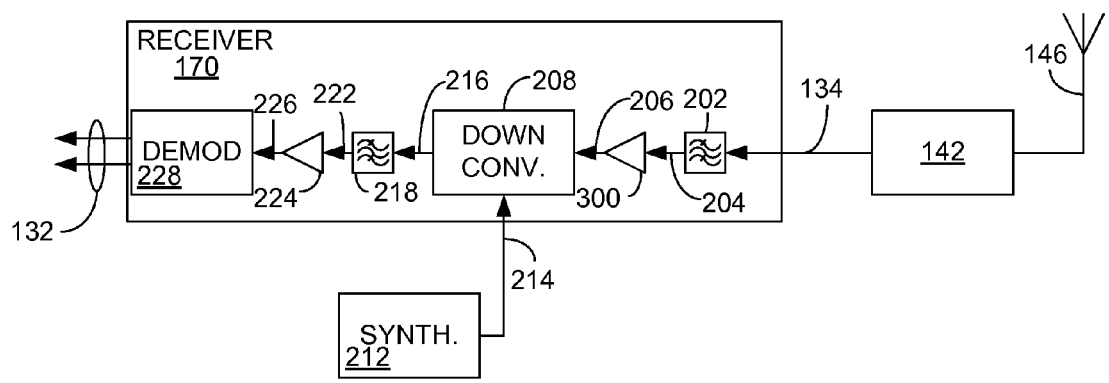
FIG. 2 is a schematic diagram illustrating an embodiment of a receiver of FIG. 1.

FIG. 2 is a schematic diagram illustrating an embodiment of a receiver 170 of FIG. 1. The receiver shown in FIG. 2 is one possible example of a receiver in which the multiband LNA with parallel resonant feedback can be implemented, and is not intended to be limiting.

A signal received by antenna 146 may, at the appropriate time determined by the baseband subsystem 110, be directed via the TX/RX switch 142 and connection 134 to a receive filter 202. The receive filter 202 filters the received signal and supplies the filtered signal on connection 204 to a low noise amplifier (LNA) 300. The LNA 300 is an embodiment of the multiband LNA with parallel resonant feedback and will be described in detail below.

The receive filter 202 may be a bandpass filter that passes all channels of the particular cellular system where the portable transceiver 100 is operating. As an example, for a 900 MHz GSM system, receive filter 202 would pass all frequencies from 935 MHz to 960 MHz, covering 124 contiguous downlink channels of 200 kHz each. The purpose of the receive filter 202 is to reject all frequencies outside the desired region. The LNA 300 amplifies the relatively weak signal on connection 204 to a level at which downconverter 208 can translate the signal from the transmitted frequency back to a baseband frequency.

The downconverter 208 receives an LO signal from synthesizer 212 via connection 214. The LO signal determines the frequency to which to downconvert the signal received from the LNA 300 via connection 206. The downconverted frequency can be either an intermediate frequency (IF), or a near-baseband frequency if the receiver is implemented as a direct conversion receiver (DCR). The downconverter 208 sends the downconverted signal via connection 216 to a channel filter 218. The channel filter 218 filters the downconverted signal and supplies it via connection 222 to an amplifier 224. The channel filter 218 selects the one desired channel and rejects all others. Using the GSM system as an example, only one of the 125 contiguous channels is actually to be received. After all channels are passed by the receive filter 202 and downconverted in frequency by the downconverter 208, only the one desired channel will appear at the center frequency of channel filter 222. The synthesizer 212, by controlling the local oscillator frequency supplied on connection 214 to downconverter 208, determines the selected channel. The amplifier 224 amplifies the received signal and supplies the amplified signal via connection 226 to demodulator 228. The demodulator 228 recovers the transmitted analog information and supplies a signal representing this information via connection 132 to the baseband subsystem 110 (FIG. 1) for further processing.

Figure 3:
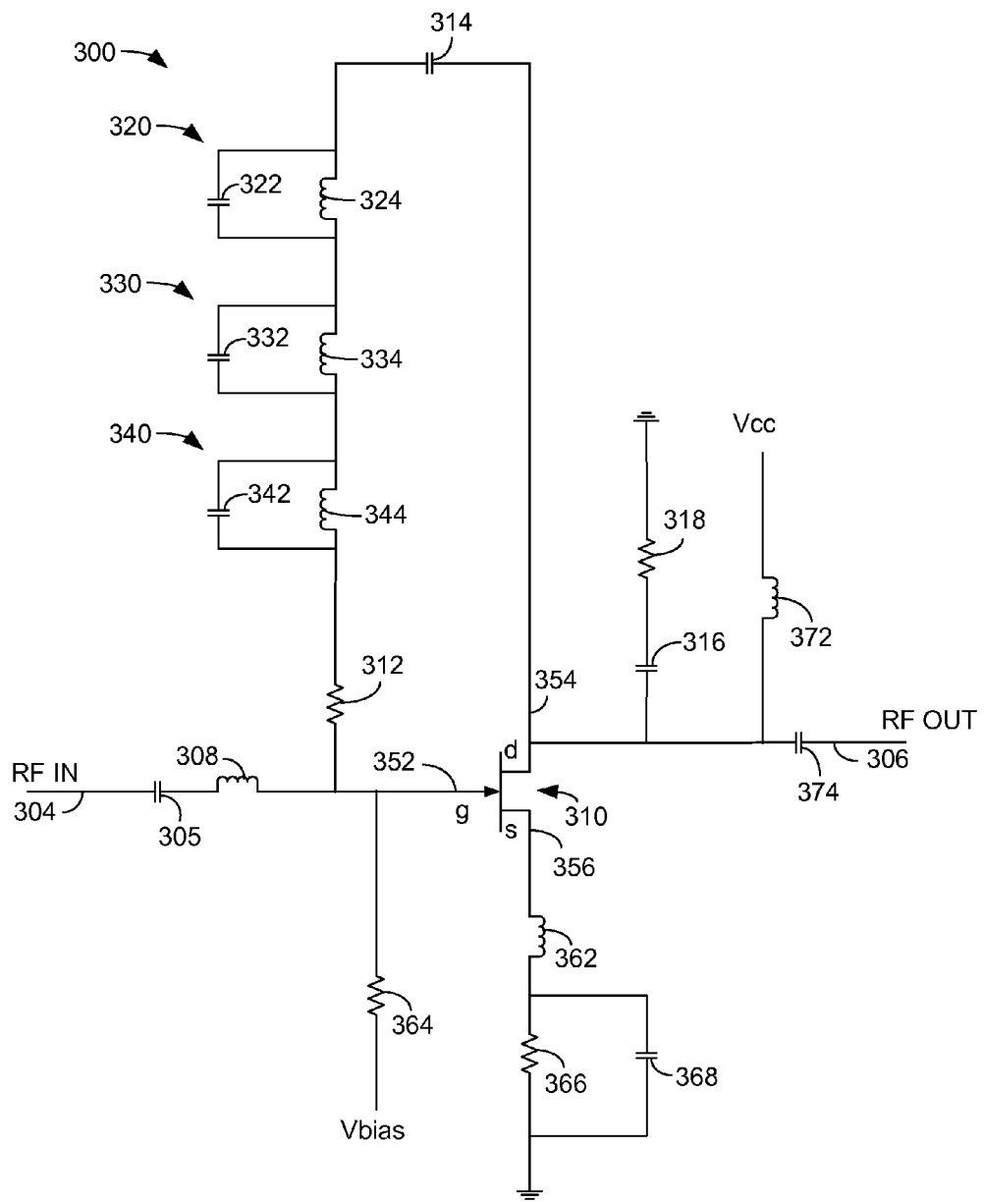
FIG. 3 is a schematic diagram illustrating an embodiment of a low noise amplifier (LNA) with parallel resonant feedback.

FIG. 3 is a schematic diagram illustrating an embodiment of a multiband low noise amplifier (LNA) with parallel resonant feedback. The structure of the low noise amplifier 300 shown in FIG. 3 is one possible implementation example of a multiband low noise amplifier with parallel resonant feedback. Other structures are possible. In an embodiment, the low noise amplifier 300 comprises a field effect transistor (FET) device 310 as an amplification element, which, in this embodiment, is a depletion-mode device connected as a common source amplifier. However, the transistor may be implemented in other ways and using other technologies, such as bipolar junction transistor (BJT) technology.

The radio frequency (RF) input signal from the receive filter 202 (FIG. 2) is supplied over connection 304, through a DC blocking capacitor 305, and to an inductor 308. The connection 304 in FIG. 3 is similar to the connection 204 in FIG. 2. The inductor 308 provides RF input impedance matching and is coupled to the gate 352 of the transistor 310. The source 356 of the transistor 310 is coupled through an inductor 362 to a bias network comprising a resistor 366 and a capacitor 368. The value of resistor 366 and a bias voltage, Vbias, determine the bias current of the transistor 310. The capacitor 368 operates as a bypass capacitor, bypassing the RF signal across the resistor 366. A gate resistor 364 connected to the bias voltage signal, Vbias, sets the operating parameters of the transistor 310. The gate resistor 364 sets the gate bias, which in this embodiment is a negative or zero bias voltage appropriate for a depletion mode transistor 310. In an embodiment, the resistor 364 has a value of 2070 ohms ($\Omega$). In this embodiment, the resistor 366 has an exemplary value of 9$\Omega$ and the capacitor 368 has an exemplary value of 1000 picofarads (pF). The inductor 362 has an exemplary value of 0.4 nanohenrys (nH).

The output of the transistor 310 is provided from the drain 354 where the RF output is provided over connection 306 through a DC blocking capacitor 374. The connection 306 is similar to the connection 206 of FIG. 2. An optional stabilizing network comprising a resistor 318 and a capacitor 316 may also be provided at the RF output 306. The resistor 318 has an exemplary value of 301$\Omega$ and the capacitor 316 has an exemplary value of 0.576 pF. System voltage, Vcc, is provided to the capacitor 374 through an inductor 372 operating as an RF choke.

In accordance with an embodiment of the low noise amplifier with parallel resonant feedback, at least one, and typically, a plurality of resonant circuits 320, 330 and 340 are coupled in series between the gate 352 and the drain 354 of the transistor 310. The resonant circuits 320, 330 and 340 are referred to as "parallel" resonant circuits because they are located in parallel with the RF signal path that traverses the gate 352 and drain 354 of the transistor 310. While three resonant circuits are shown, any number of resonant circuits can be implemented, depending upon the number of receive bands.

In an embodiment, a DC blocking capacitor 314 has an exemplary value of 5.18 pF and is located between the drain 354 and the resonant circuit 320. The capacitor 314 also provides feedback optimization. In addition, a resistor 312 having an exemplary value of 650$\Omega$ provides resistive feedback at lower operating frequencies. For example, the combination of the resistor 312 and the capacitor 314 forms a resistive feedback circuit that is coupled in series with the resonant circuits 320, 330 and 340. The combination of the resistor 312 and the capacitor 314 provides resistive feedback in the 900 MHz receive band when the receive frequency is sufficiently low so that the resonant circuits 320, 330 and 340 behave effectively as short circuits. In an embodiment, the 900 MHz receive band covers the GSM900 and wideband code division multiple access (WCDMA) receive band. The capacitor 314 is used for DC blocking of the RF signal. The capacitor 314 can also be used to adjust the amount of RF feedback to optimize the RF performance. A relatively high value capacitor is used for operation at relatively low frequencies and a relatively low value is used for operation at relatively higher frequencies. An approximate value of the capacitor 314 for operation at 900 MHz is approximately 5.2 picofarads (pF).

The resonant circuit 320 includes a capacitor 322 and an inductor 324. In this example, the value of the capacitor 322 is 2.9 pF and the value of the inductor 324 is 1.8 nH. The resonant circuit 330 includes a capacitor 332 and an inductor 334. In this example, the value of the capacitor 332 is 3.8 pF and the value of the inductor 334 is 1.9 nH. The resonant circuit 340 includes a capacitor 342 and an inductor 344. In this example, the value of the capacitor 342 is 1.8 pF and the value of the inductor 344 is 1.9 nH. In accordance with an embodiment of the multiband low noise amplifier with parallel resonant feedback, each of the resonant circuits 320, 330 and 340 are designed to resonate at a frequency that coincides with a desired receive band. The frequency at which each resonant circuit 320, 330 and 340 resonates is referred to as the "resonant frequency." Stated another way, each resonant circuit becomes an open circuit at the desired (resonant) frequency, and thus removes the undesirable effect of resistive feedback for the amplifier 310 at that particular resonant frequency.

For example, the resonant circuit 320 is designed to resonate, and thus become an effective open circuit, at approximately 2.1 GHz, the resonant circuit 330 is designed to resonate at approximately 1.8 GHz, and the resonant circuit 340 is designed to resonate at approximately 2.6 GHz. In this manner, four receive frequency bands (900 MHz, 1.8/1.9 GHz, 2.1 GHz and 2.6 GHz) are covered by the structure shown in FIG. 3, including the resistive feedback provided by the resistor 312 and the capacitor 314 at lower frequencies. To eliminate the undesirable effect of resistive feedback at the resonant frequencies, the resonant circuits become open circuits at higher frequencies, such as 1.8/1.9 GHz, 2.1 and 2.6 GHz in the example. The resonant circuits are close to, and effectively, short circuits at frequencies that are below the resonant frequency of each resonant circuit. For example, at 900 MHz all the resonant circuits 320, 330 and 340 are effective short circuits and hence, the feedback circuit can be simplified as represented by the resistor 312 and the capacitor 314 connected in series, which provide resistive feedback. The parallel resistive feedback provided by the resistor 312 and the capacitor 314 is a desired feedback structure at relatively low frequencies (900 MHz) but is undesired at higher frequencies. At higher frequencies such as 1.8/1.9 GHz, 2.1 GHz and 2.6 GHz in this example, the resonant circuits 320, 330 and 340 reduce the feedback by behaving as effective RF open circuits at their respective resonant frequencies, thus decoupling the undesirable RF feedback at those resonant frequencies.

While the resonant circuits 320, 330 and 340 are depicted with discrete capacitive and inductive components, other resonant structures, including active resonant structures using, for example, active inductors and varactors, can be implemented to create the resonant feedback.

The multiband low noise amplifier with parallel resonant feedback introduces little noise and simultaneously provides flat gain, good input and output return loss and a high degree of linearity at multiple frequency bands. The parallel resistive feedback from drain 354 to gate 352 provides a flat gain profile across the operating band. Further, the resistive feedback provided by the resistor 312 and capacitor 314 helps reduce the input and output return loss at relatively low frequencies, such as at the mentioned 900 MHz receive band, and substantially eliminates low frequency oscillations.

Using the structure shown in FIG. 3 for example, approximately 0.4 dB of noise figure improvement at 2.7 GHz is achieved without degrading any other performance parameters. An advantage of this solution is that it allows a single amplifier to be used for multiple band operation. It eliminates the costly situation of using multiple amplifiers and also allows easy customization for different bands. Further, it simplifies the impedance matching for input and output ports.

Figure 4:
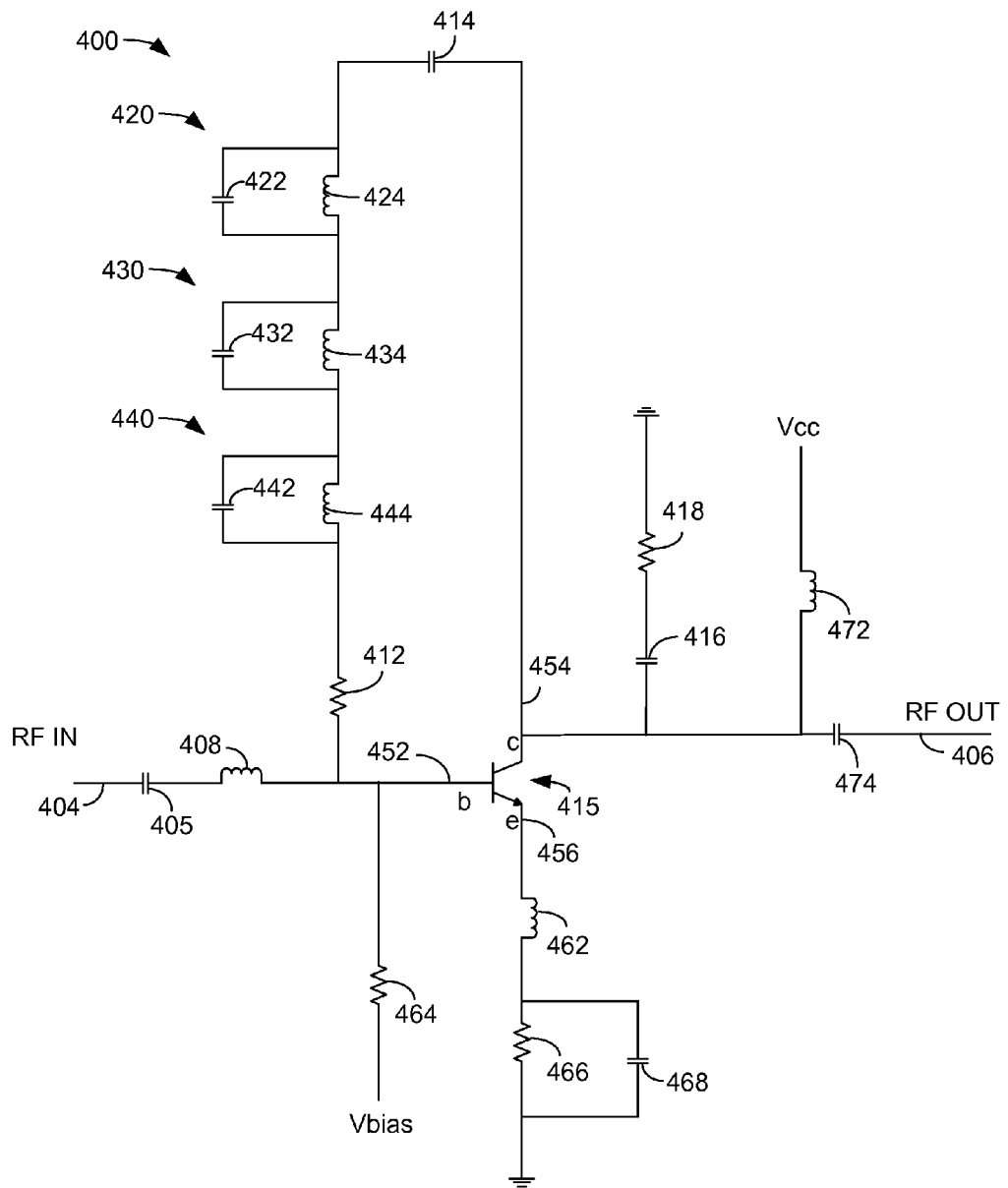
FIG. 4 is a schematic diagram illustrating an alternative embodiment of a low noise amplifier (LNA) with parallel resonant feedback.

FIG. 4 is a schematic diagram illustrating an alternative embodiment of a multiband low noise amplifier (LNA) with parallel resonant feedback. The embodiment of the multiband low noise amplifier shown in FIG. 4 is similar to the embodiment shown in FIG. 3. Therefore, elements in FIG. 4 that are similar to elements in FIG. 3 are labeled according to the convention 4XX, where the "XX" in FIG. 4 is similar to the like numbered element in FIG. 3.

The structure of the low noise amplifier 400 shown in FIG. 4 is one possible implementation example of a multiband low noise amplifier with parallel resonant feedback. Other structures are possible. The multiband low noise amplifier with parallel resonant feedback 400 uses a bipolar junction transistor (BJT) amplifier 415 instead of a FET device described in FIG. 3 as the amplification element.

The radio frequency (RF) input signal from the receive filter 202 (FIG. 2) is supplied over connection 404 through a DC blocking capacitor 405 to an inductor 408. The connection 404 in FIG. 4 is similar to the connection 204 in FIG. 2. The inductor 408 provides RF input impedance matching and is coupled to the base 452 of the transistor 415.

The emitter 456 of the transistor 415 is coupled through an inductor 462 to a bias network comprising a resistor 466 and a capacitor 468. A base resistor 464 connected to a bias voltage signal, Vbias, sets the operating parameters of the transistor 415. In an embodiment, the resistor 464 has a value of 2070 ohms (Ω). In this embodiment, the resistor 466 has an exemplary value of 9Ω, the capacitor 468 has an exemplary value of 1000 picofarads (pF) and the inductor 462 has an exemplary value of 0.4 nanohenrys (nH).

The output of the transistor 415 is provided from the collector 454 where the RF output is provided over connection 406 through a DC blocking capacitor 474. The connection 406 is similar to the connection 206 of FIG. 2. An optional stabilizing network comprising a resistor 418 and a capacitor 416 may also be provided at the RF output 406. The resistor 418 has an exemplary value of 301Ω and the capacitor 416 has an exemplary value of 0.576 pF. System voltage, Vcc, is provided to the capacitor 474 through an inductor 472 operating as an RF choke.

In accordance with an embodiment of the multiband low noise amplifier with parallel resonant feedback, at least one, and typically, a plurality of resonant circuits are coupled between the collector 454 and the base 452 of the transistor 410. In an embodiment, a DC blocking capacitor 414 having an exemplary value of 5.18 pF is connected between the collector 454 and the resonant circuit 420. The capacitor 414 also provides feedback optimization. In addition, a resistor 412 having an exemplary value of 650Ω provides resistive feedback at lower operating frequencies when the resonant circuits 420, 430 and 440 are effective short circuits. For example, the combination of the resistor 412 and the capacitor 414 provides resistive feedback in the 900 MHz receive band at which frequency the resonant circuits 420, 430 and 440 are effective short circuits. In an embodiment, the 900 MHz receive band covers the GSM900 and wideband code division multiple access (WCDMA) receive band. While three resonant circuits are shown, any number of resonant circuits can be implemented, depending upon the number of receive bands.

The resonant circuit 420 includes a capacitor 422 and an inductor 424. In this example, the value of the capacitor 422 is 2.9 pF and the value of the inductor 424 is 1.8 nH. The resonant circuit 430 includes a capacitor 432 and an inductor 434. In this example, the value of the capacitor 432 is 3.8 pF and the value of the inductor 434 is 1.9 nH. The resonant circuit 440 includes a capacitor 442 and an inductor 444. In this example, the value of the capacitor 442 is 1.8 pF and the value of the inductor 444 is 1.9 nH. In accordance with an embodiment of the low noise amplifier with parallel resonant feedback, each of the resonant circuits 420, 430 and 440 are designed to resonate at a different frequency that coincides with a desired receive band, as described above. Stated another way each resonant circuit becomes an open circuit at the desired (resonant) frequency, and thus removes the undesired effect of resistive feedback for the amplifier 415 at that particular resonant frequency.

For example, the resonant circuit 420 is designed to resonate at, and thus become an effective open circuit, at approximately 2.1 GHz, the resonant circuit 430 is designed to resonate at approximately 1.8 GHz, and the resonant circuit 440 is designed to resonate at approximately 2.6 GHz. In this manner, four receive frequency bands (900 MHz, 1.8/1.9 GHz, 2.1 GHz and 2.6 GHz) are covered by the structure shown in FIG. 4, including the resistive feedback provided by the resistor 412 and the capacitor 414 at lower frequencies, as described above. To eliminate the undesirable effect of resistive feedback at the resonant frequencies, the resonant circuits become open circuits at higher frequencies, such as 1.8/1.9 GHz, 2.1 and 2.6 GHz, as described above.

While various embodiments of the invention have been described, it will be apparent to those of ordinary skill in the art that many more embodiments and implementations are possible that are within the scope of the invention. For example, the invention is not limited to a specific type of communication device or receiver. Embodiments of the invention are applicable to different types of amplifiers, communication devices and receivers.

What is claimed is:

1. A multiband low noise amplifier (LNA) for operation at multiple receive frequency bands in a portable communication device, the multiband LNA comprising:
    an amplifier element configured to receive a radio frequency (RF) signal at an RF input and provide an amplified version of the RF signal at an RF output;
    a resistive feedback circuit coupled between the RF input and the RF output; and
    a plurality of series-coupled resonant circuits coupled in series with the resistive feedback circuit between the RF input and the RF output of the amplifier element, each of the series-coupled resonant circuits having an inductance and a capacitance, each of the series-coupled resonant circuits being configured to resonate at a frequency that coincides with a desired receive frequency band, each of the series-coupled resonant circuits being configured to operate as an effective short circuit at a frequency other than a resonant frequency and being configured to operate as an effective open circuit at the resonant frequency to decouple the resistive feedback circuit from the amplifier element at each resonant frequency.

2. The multiband low noise amplifier of claim 1 in which each of the plurality of series-coupled resonant circuits decouple the resistive feedback circuit from the amplifier element at a different resonant frequency.

3. The multiband low noise amplifier of claim 1 in which the amplifier element is a field effect transistor (FET).

4. The multiband low noise amplifier of claim 1 in which the amplifier element is a bipolar junction transistor (BJT).

5. A portable communication device having a multiband low noise amplifier for operation at multiple receive frequency bands, the portable communication device comprising:
    a transmitter configured to receive a baseband information signal and configured to provide a modulated transmit signal to a power amplifier; and
    a receiver configured to receive a radio frequency (RF) signal in at least one of a plurality of receive frequency bands, the receiver including a multiband low noise amplifier having an amplifier element,
    a resistive feedback circuit, a plurality of series-coupled parallel resonant circuits, a down-converter, and a demodulator, each of the plurality of series-coupled parallel resonant circuits being configured to resonate at a frequency that coincides with a desired receive frequency band;
    each of the series-coupled resonant circuits being configured to operate as an effective short circuit at a frequency other than a resonant frequency and being configured to operate as an effective open circuit at the resonant frequency to decouple the resistive feedback circuit from the amplifier element at each resonant frequency.

6. The portable communication device of claim 5 in which each of the plurality of series-coupled resonant circuits decouple the resistive feedback circuit from the amplifier element at a different resonant frequency.

7. The portable communication device of claim 5 in which the amplifier element is a field effect transistor (FET).

8. The portable communication device of claim 5 in which the amplifier element is a bipolar junction transistor (BJT).

9. The portable communication device of claim 5 wherein the amplifier element is configured to receive an RF signal at an RF input and provide an amplified version of the RF signal at an RF output.

10. The portable communication device of claim 9 wherein the resistive feedback circuit is coupled between the RF input and the RF output.

11. The portable communication device of claim 10 wherein the plurality of series-coupled resonant circuits is coupled in series with the resistive feedback circuit between the RF input and the RF output of the amplifier element, each of the series-coupled resonant circuits having an inductance and a capacitance.

12. The portable communication device of claim 11 wherein the series-coupled resonant circuit includes at least one of a discrete inductor and an active inductor to provide the inductance.

13. The portable communication device of claim 11 wherein the series-coupled resonant circuit includes at least one of a discrete capacitor and a varactor to provide the capacitance.

14. The portable communication device of claim 11 wherein each of the series-coupled resonant circuits is configured to operate as an effective short circuit at a frequency other than a resonant frequency.

15. The portable communication device of claim 11 wherein each of the series-coupled resonant circuits is configured to operate as an effective open circuit at its resonant frequency to decouple the resistive feedback from the amplifier element at each resonant frequency.

16. The portable communication device of claim 9 wherein the downconverter is configured to convert the received RF signal to a baseband information signal.

17. The portable communication device of claim 16 wherein the demodulator is configured to extract the baseband information signal.

18. The multiband low noise amplifier of claim 1 wherein the series-coupled resonant circuit includes at least one of a discrete inductor and an active inductor to provide the inductance.

19. The multiband low noise amplifier of claim 1 wherein the series-coupled resonant circuit includes at least one of a discrete capacitor and a varactor to provide the capacitance.

* * * * *

UNITED STATES PATENT AND TRADEMARK OFFICE
CERTIFICATE OF CORRECTION

PATENT NO. : 8,644,773 B2
APPLICATION NO. : 12/634706
DATED : February 4, 2014
INVENTOR(S) : Cebi Page 1 of 1

It is certified that error appears in the above-identified patent and that said Letters Patent is hereby corrected as shown below:

In the Claims:

In column 9 at line 50 (approx.), In Claim 5, change "down-converter," to --downconverter,--.

Signed and Sealed this
Twelfth Day of August, 2014

Michelle K. Lee
*Deputy Director of the United States Patent and Trademark Office*